(12) United States Patent
Kim (10) Patent No.: US 11,151,352 B2
(45) Date of Patent: *Oct. 19, 2021

(54) DISPLAY DEVICE

(71) Applicant: SAMSUNG DISPLAY CO., LTD., Yongin-si (KR)

(72) Inventor: Sang Woo Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/798,147

(22) Filed: Feb. 21, 2020

(65) Prior Publication Data

US 2020/0193125 A1 Jun. 18, 2020

Related U.S. Application Data

(63) Continuation of application No. 16/019,159, filed on Jun. 26, 2018, now Pat. No. 10,586,090.

(30) Foreign Application Priority Data

Dec. 29, 2017 (KR) ......................... 10-2017-0184867

(51) Int. Cl.
| | |
|---|---|
| G06K 9/00 | (2006.01) |
| H01L 51/52 | (2006.01) |
| G06K 9/22 | (2006.01) |
| G06F 1/16 | (2006.01) |
| H01L 27/32 | (2006.01) |
| H01L 27/30 | (2006.01) |

(52) U.S. Cl.
CPC ......... *G06K 9/0004* (2013.01); *G06F 1/1643* (2013.01); *G06K 9/22* (2013.01); *H01L 51/5237* (2013.01); *H01L 27/307* (2013.01); *H01L 27/323* (2013.01); *H01L 27/3244* (2013.01); *H01L 51/5284* (2013.01)

(58) Field of Classification Search
CPC ...... G06K 9/0004; G06K 9/22; G06F 1/1643; H01L 51/5237
See application file for complete search history.

(56) References Cited

U.S. PATENT DOCUMENTS

| | | | |
|---|---|---|---|
| 10,139,938 B2* | 11/2018 | Deng ................. | G06K 9/00013 |
| 2014/0295180 A1 | 10/2014 | Yamagata et al. | |
| 2017/0220840 A1* | 8/2017 | Wickboldt ........... | G06K 9/0004 |
| 2019/0073505 A1* | 3/2019 | Kwon ................. | G06K 9/0004 |
| 2019/0094425 A1* | 3/2019 | Liu ..................... | G06K 9/0004 |
| 2019/0156094 A1* | 5/2019 | Du ...................... | G06K 9/0004 |

(Continued)

FOREIGN PATENT DOCUMENTS

| | | |
|---|---|---|
| KR | 10-0948766 B1 | 3/2010 |
| KR | 10-2016-0110468 A | 9/2016 |
| KR | 10-2017-0059066 A | 5/2017 |

*Primary Examiner* — Utpal D Shah
(74) *Attorney, Agent, or Firm* — Lewis Roca Rothgerber Christie LLP (57) ABSTRACT

A display device includes a transparent display panel, which includes a display area, the display area having a fingerprint recognition region; a rear surface film attached to the rear surface of the transparent display panel and having a through-hole corresponding to the fingerprint recognition region; a fingerprint sensor in the through-hole; and a photochromic part overlapping the through-hole.

17 Claims, 4 Drawing Sheets

(56) References Cited

U.S. PATENT DOCUMENTS

2019/0205594 A1* 7/2019 Lee ................... G06F 1/1684
2019/0205603 A1* 7/2019 Lee ................... G06K 9/0002
2019/0244002 A1* 8/2019 Ye .................... H01L 27/3244
2019/0294852 A1* 9/2019 Vogel ................ A61B 5/14551

* cited by examiner

DISPLAY DEVICE

CROSS-REFERENCE TO RELATED APPLICATION

This application is a continuation of U.S. patent application Ser. No. 16/019,159, filed Jun. 26, 2018, which claims priority to and the benefit of Korean Patent Application No. 10-2017-0184867, filed Dec. 29, 2017, the entire content of both of which is incorporated herein by reference.

BACKGROUND

1. Field

The present disclosure relates to a display device.

2. Description of the Related Art

Generally, as examples of display devices, there are organic light emitting diode (OLED) displays, liquid crystal displays (LCDs), and plasma display panels (PDPs).

Among them, the organic light emitting diode display may be formed of a transparent display panel including organic light emitting elements.

Recently, a display device in which a display area for displaying an image is formed on an entire front surface of the display device and a fingerprint recognition unit is positioned at a rear surface of the display device has been developed.

The above information disclosed in this Background section is only for enhancement of understanding of the background of the invention and therefore it may contain information that does not form prior art.

SUMMARY

An aspect according to an exemplary embodiment is directed toward a display device in which a fingerprint sensor positioned at the rear surface of the transparent display panel is suppressed from being recognized (e.g., visible) even when the transparent display panel includes the display area having a fingerprint recognition region on the front surface.

According to an embodiment, a display device includes a transparent display panel including a display area, the display area including a fingerprint recognition region; a rear surface film on a rear surface of the transparent display panel and having a through-hole formed corresponding to the fingerprint recognition region; a fingerprint sensor in the through-hole; and a photochromic part overlapping the through-hole.

The photochromic part may be in the through-hole.

The fingerprint sensor may be between the transparent display panel and the photochromic part.

The photochromic part may fill an inside of the through-hole.

The photochromic part may be between the transparent display panel and the rear surface film.

The photochromic part may be positioned over the entire rear surface of the transparent display panel.

The photochromic part may be in direct contact with the rear surface film.

The fingerprint recognition region may be at a center under the display area.

The rear surface film may further include: a black layer on the rear surface of the transparent display panel; a thermal transmitting layer separated from the black layer; and a cushion layer between the black layer and the thermal transmitting layer.

The through-hole may penetrate the black layer, the thermal transmitting layer, and the cushion layer.

The photochromic part may be colored by ultraviolet rays.

The photochromic part may include a silver halide.

The fingerprint sensor may include a photosensor.

The transparent display panel may include an organic light emitting element.

According to another embodiment, a display device includes a transparent display panel including a display area, the display area including a fingerprint recognition region; a rear surface film on a rear surface of the transparent display panel and having a through-hole formed corresponding to the fingerprint recognition region; a photochromic part in the through-hole; and a fingerprint sensor overlapping the through-hole.

The photochromic part may completely fill an inside of the through-hole.

The fingerprint sensor may be separated from the photochromic part.

According to an exemplary embodiment, even when the transparent display panel of a display device includes the display area having the fingerprint recognition region at the front surface, and the fingerprint sensor positioned at the rear surface of the transparent display panel is suppressed from being recognized (e.g., visible).

DETAILED DESCRIPTION

The embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clearly explain the present embodiments, portions that are not directly related to the present embodiments are omitted, and the same reference numerals are used to refer to the same or similar constituent elements through the entire specification.

In addition, the size and thickness of each configuration shown in the drawings are arbitrarily shown for better understanding and ease of description, but the present invention is not limited thereto. In the drawings, the thickness of layers, films, panels, regions, etc., may be exaggerated for clarity, better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Now, a display device according to an exemplary embodiment will be described with reference to FIG. 1.

Figure 1:
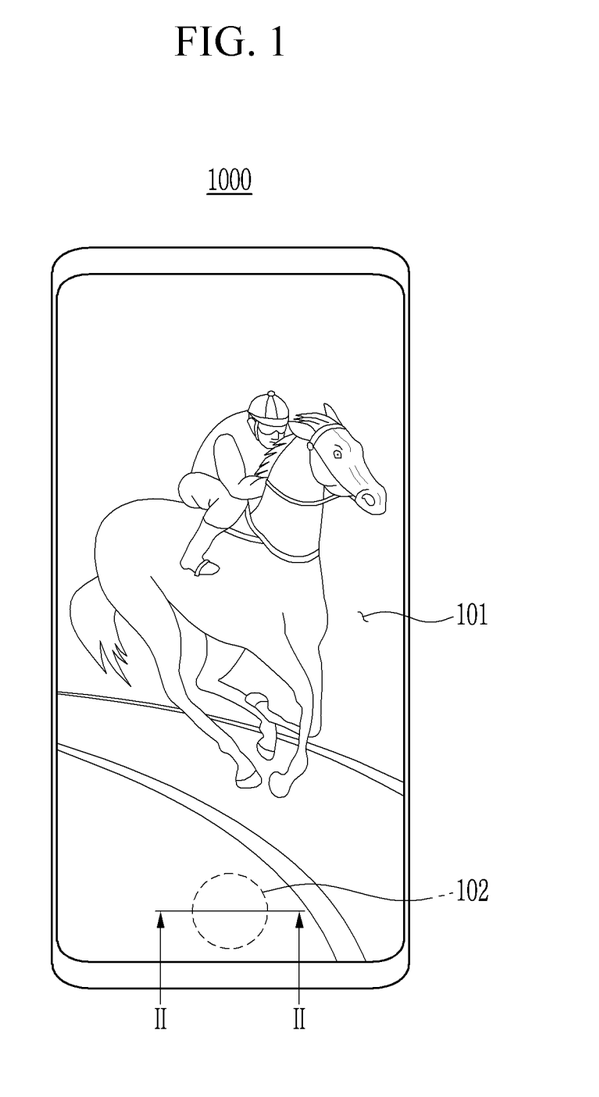
FIG. 1 is a top plan view showing a display device according to an exemplary embodiment.
Figure 2:
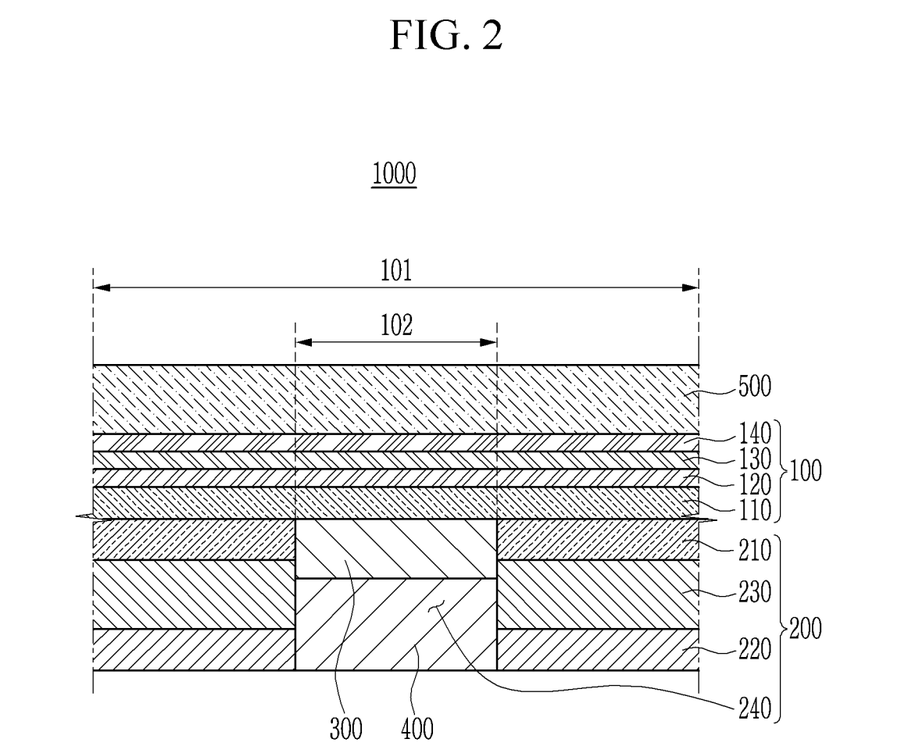
FIG. 2 is a cross-sectional view taken along the line II-II shown in FIG. 1.

FIG. 1 is a top plan view showing a display device according to an exemplary embodiment. FIG. 2 is a cross-sectional view taken along the line II-II shown in FIG. 1. FIG. 2 shows a portion (e.g., main configurations) of the display device shown in FIG. 1, and the display device according to an exemplary embodiment may further include various suitable configurations such as a flexible printed circuit board (PCB), a frame, a case, an optical film, etc.

Referring to FIG. 1 and FIG. 2, the display device 1000 includes a transparent display panel 100, a rear surface film 200, a fingerprint sensor 300, a photochromic part 400, and a window 500.

The transparent display panel 100 includes a display area 101. The display area 101 displays an image. The display area 101 is formed over the entire front surface of the transparent display panel 100. The display area 101 includes a fingerprint recognition region 102.

The fingerprint recognition region 102 is positioned inside the display area 101. The fingerprint recognition region 102 is positioned at the front surface of the transparent display panel 100. The fingerprint recognition region 102 is a region where the fingerprint of a user is recognized. The fingerprint recognition region 102 is positioned at a location (e.g., a center, e.g., a middle point between the left and right edges of the display area) under the display area 101.

The transparent display panel 100 includes a substrate 110, a driving unit (e.g., a driver unit) 120, an organic light emitting element 130, and an encapsulation layer 140.

The substrate 110 may include a polymer (such as polyimide, polyethylene, polypropylene, etc.), or glass.

The substrate 110 may be a flexible substrate or a rigid substrate.

The driving unit 120 is positioned on the substrate 110. The driving unit 120 includes a plurality of thin film transistors, at least one capacitor, and a plurality of wires connected to the plurality of thin film transistors and the at least one capacitor. The driving unit 120 may have various suitable (e.g., disclosed) structures.

The organic light emitting element 130 is positioned on the driving unit 120.

The organic light emitting element 130 includes a first electrode, a second electrode positioned on the first electrode, and an organic emission layer positioned between the first electrode and the second electrode. The organic light emitting element 130 may have various suitable (e.g., disclosed) structures.

On the other hand, while the transparent display panel 100 according to an exemplary embodiment includes an organic light emitting element 130, the transparent display panel 100 may include a display unit including other kinds of elements for displaying the image, such as a liquid crystal in another exemplary embodiment, and the display unit may have various suitable (e.g., disclosed) structures.

The encapsulation layer 140 is positioned on the organic light emitting element 130. The encapsulation layer 140 encapsulates the driving unit 120 and the organic light emitting element 130 along with the substrate 110. The encapsulation layer 140 may include at least one organic layer and at least one inorganic layer. The organic layer and the inorganic layer may be alternately stacked on the organic light emitting element 130.

On the other hand, while the transparent display panel 100 includes a multi-layer encapsulation layer 140 in an exemplary embodiment, the transparent display panel 100 may include an encapsulation substrate of a substrate type (e.g., a single layer) in another exemplary embodiment.

The window 500 is positioned at the front surface of the transparent display panel 100. The rear surface film 200, the fingerprint sensor 300, and the photochromic part 400 are positioned at the rear surface (positioned at the side opposite to the front surface) of the transparent display panel 100.

The rear surface film 200 is attached to the rear surface of the transparent display panel 100. The rear surface film 200 is opaque. The rear surface film 200 suppresses external light from being reflected through the transparent display panel 100. Configurations such as a flexible printed circuit board (PCB) or a printed circuit board (PCB) that are positioned at the rear surface side of the transparent display panel 100 are suppressed from being recognized (e.g., visible) from the outside by the rear surface film 200.

The rear surface film 200 includes a black layer 210, a thermal transmitting layer 220, a cushion layer 230, and a through-hole 240.

The black layer 210 is positioned on the rear surface of the transparent display panel 100, and suppresses the reflection of the external light transmitted through the transparent display panel 100.

The thermal transmitting layer 220 may be separated from the black layer 210, and may disperse (e.g., dissipate) heat generated by the transparent display panel 100.

The cushion layer 230 is positioned between the black layer 210 and the thermal transmitting layer 220. The cushion layer 230 disperses (e.g., absorbs) an impact applied to the transparent display panel 100, thereby improving impact resistance of the display device 1000.

The black layer 210 and the cushion layer 230 may be a foam layer in which a plurality of spaces (e.g., pores) are positioned in a matrix (e.g., a matrix shape) therein, however, the present invention is not limited thereto.

The through-hole 240 corresponds to the fingerprint recognition region 102 of the transparent display panel 100. The through-hole 240 overlaps the fingerprint recognition region 102. The through-hole 240 exposes the rear surface of the transparent display panel 100 through the black layer 210, the thermal transmitting layer 220, and the cushion layer 230. The area of the through-hole 240 is the same as the area of the fingerprint recognition region 102, however, the present invention is not limited thereto, and the area of the through-hole 240 may be larger or smaller than the area of the fingerprint recognition region 102.

The fingerprint sensor 300 and the photochromic part 400 are positioned inside the through-hole 240 of the rear surface film 200.

The fingerprint sensor 300 is positioned inside the through-hole 240 of the rear surface film 200. The fingerprint sensor 300 faces the rear surface of the transparent display panel 100. The fingerprint sensor 300 is a sensor for recognizing a fingerprint of a user which may be positioned at the front of the transparent display panel 100.

The fingerprint sensor 300 may be a photosensor, however the present invention is not limited thereto.

For example, the fingerprint sensor 300 may irradiate light (such as infrared rays, etc.,) from the rear surface of the transparent display panel 100 to the front surface of the transparent display panel 100 (e.g., through the body of transparent display panel 100), and may sense the light reflected by the fingerprint of the user positioned at the front surface of the transparent display panel 100, thereby recognizing the fingerprint pattern of the user.

The fingerprint sensor 300 may be connected to a flexible printed circuit board (PCB) or a printed circuit board (PCB).

The fingerprint sensor 300 is positioned between the transparent display panel 100 and the photochromic part 400.

The photochromic part 400 overlaps the through-hole 240 and is positioned in the through-hole 240.

The photochromic part 400 is in direct contact with the rear surface film 200. The photochromic part 400 fills the inside of the through-hole 240 to not expose the through-hole 240.

The photochromic part 400 may be in a transparent state when irradiated with visible rays and/or infrared rays, and may be in a colored state (e.g., may turn opaque) when irradiated with ultraviolet rays.

That is, the photochromic part 400 is colored by ultraviolet rays when the external light is irradiated to the photochromic part 400 through the fingerprint sensor 300 after passing through the front surface and the rear surface of the transparent display panel 100.

Also, the photochromic part 400 returns to the transparent state when the external light (e.g., ultraviolet rays) is not irradiated to the transparent display panel 100.

The photochromic part 400 may include a transparent main body and a photochromic material including a halide included (e.g., mixed) in the transparent main body, however, the present invention is not limited thereto.

For example, the photochromic part 400 may include the photochromic material including at least one selected from a zinc halide, a cadmium halide, a copper halide, a magnesium halide, spiropyrane, spironaphthoxazine dye, diarylethene derivatives, dihydropyridine, furylfulgide derivatives, and axobenzene derivatives.

In this way, the photochromic part 400 has high light transmittance in a condition in which external light is weak, for example, in a room. Also, the photochromic part 400 is colored (e.g., turns opaque) in a condition in which the external light is strong, for example, outdoors, thereby having a high light absorption rate.

The window 500 is positioned at the front surface of the transparent display panel 100. The window 500 may protect the front surface of the transparent display panel 100. At least one among a touch sensor, an optical layer, and an adhesive layer may be positioned between the window 500 and the transparent display panel 100.

As described above, even when the display device 1000 according to an exemplary embodiment includes the transparent display panel 100, which includes the display area 101 having the fingerprint recognition region 102 at the front surface, and the fingerprint sensor 300 overlapping the fingerprint recognition region 102 at the rear surface (of the transparent display panel 100), as the fingerprint sensor 300 is positioned between the transparent display panel 100 and the photochromic part 400, the photochromic part 400 is colored by ultraviolet rays of the external light such that the external light passing through the transparent display panel 100 is absorbed by the photochromic part 400. Therefore, the fingerprint sensor 300 positioned at the rear surface of the transparent display panel 100 is not recognized (e.g., visible) at the outside, e.g., outdoors.

That is, even when the transparent display panel 100 of the display device 1000 includes the display area 101 having the fingerprint recognition region 102, the fingerprint sensor 300 positioned at the rear surface of the transparent display panel 100 is suppressed from being recognized (e.g., visible).

Next, the display device according to another exemplary embodiment will be described with reference to FIG. 3. Hereinafter, different configurations from the above-described display device according to an exemplary embodiment will be described, and descriptions on the same or similar configurations will not be repeated.

Figure 3:
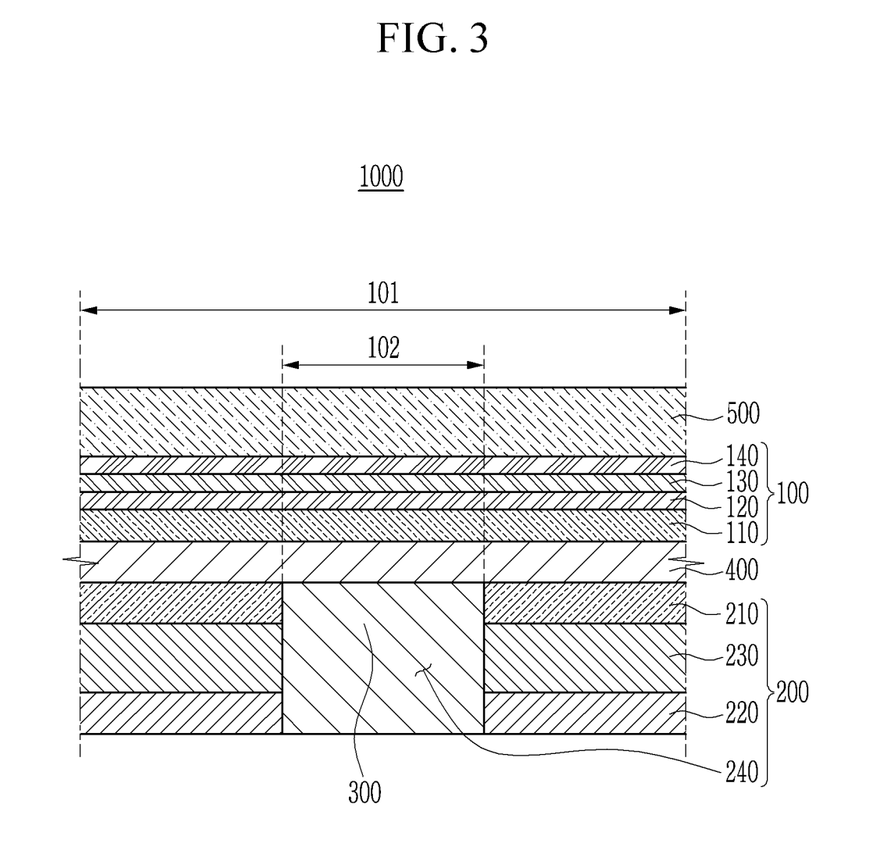
FIG. 3 is a cross-sectional view showing a display device according to another exemplary embodiment.

FIG. 3 is a cross-sectional view showing a display device according to another exemplary embodiment.

Referring to FIG. 3, the display device 1000 includes the transparent display panel 100, the rear surface film 200, the fingerprint sensor 300, the photochromic part 400, and the window 500.

The fingerprint sensor 300 is positioned in the through-hole 240 of the rear surface film 200. The fingerprint sensor 300 faces the photochromic part 400 positioned at the rear surface of the transparent display panel 100. The fingerprint sensor 300 is the sensor that recognizes the fingerprint of the user which may be positioned at the front of the transparent display panel 100.

The fingerprint sensor 300 may be the photosensor.

The photochromic part 400 is positioned between the transparent display panel 100 and the rear surface film 200, and is positioned between the transparent display panel 100 and the fingerprint sensor 300.

The photochromic part 400 is positioned over the entire rear surface of the transparent display panel 100. The photochromic part 400 may be attached to the rear surface of the transparent display panel 100, or may be stacked at the rear surface of the transparent display panel 100.

The photochromic part 400 is in direct contact with the transparent display panel 100 and the rear surface film 200, and is between the transparent display panel 100 and the rear surface film 200.

The photochromic part 400 has a high light transmittance when the finger (e.g., fingerprint) of the user is positioned at the fingerprint recognition region 102 in the condition that the external light is weak, for example, indoors and outdoors (e.g., when the external light is blocked by the finger of the user). Also, the photochromic part 400 is colored when the finger (e.g., fingerprint) of the user is not positioned at the fingerprint recognition region 102 in the condition that the external light is strong, for example, outdoors, thereby having the high light absorption rate.

As described above, even when the display device 1000 according to the present exemplary embodiment includes the transparent display panel 100, which includes the display area 101 having the fingerprint recognition region 102 at the front surface and the fingerprint sensor 300 overlapping the fingerprint recognition region 102 at the rear surface (of the transparent display panel 100), as the photochromic part 400 is positioned between the transparent display panel 100 and the fingerprint sensor 300, the photochromic part 400 is colored by ultraviolet rays of the external light such that the external light passing through the transparent display panel 100 is absorbed by the photochromic part 400. Therefore, the fingerprint sensor 300 positioned at the rear surface of the transparent display panel 100 is not recognized (e.g., not visible) at the outside, e.g., outdoors.

Also, in the display device 1000 according to the present exemplary embodiment, as the photochromic part 400 is positioned between the transparent display panel 100 and the fingerprint sensor 300, if the finger (e.g., fingerprint) of the user is positioned at the fingerprint recognition region 102 of the transparent display panel 100 outdoors, because the photochromic part 400 becomes transparent to have the high light transmittance, and because the light passing through the photochromic part 400 and the transparent display panel 100 from the fingerprint sensor 300 is reflected by the fingerprint of the user and is again reflected into the fingerprint sensor 300 through the transparent display panel 100 and the photochromic part 400, the fingerprint pattern of the user may be easily recognized at outdoors.

That is, even when the transparent display panel 100 of the display device 1000 includes the display area 101 having the fingerprint recognition region 102 at the front surface, the fingerprint sensor 300 positioned at the rear surface of the transparent display panel 100 is suppressed from being recognized (e.g., visible) and concurrently the fingerprint of the user is easily recognized.

Next, the display device according to another exemplary embodiment will be described with reference to FIG. 4. Hereinafter, different configurations from the above-described display device according to an exemplary embodiment will be described, and descriptions on the same or similar configurations will not be repeated.

Figure 4:
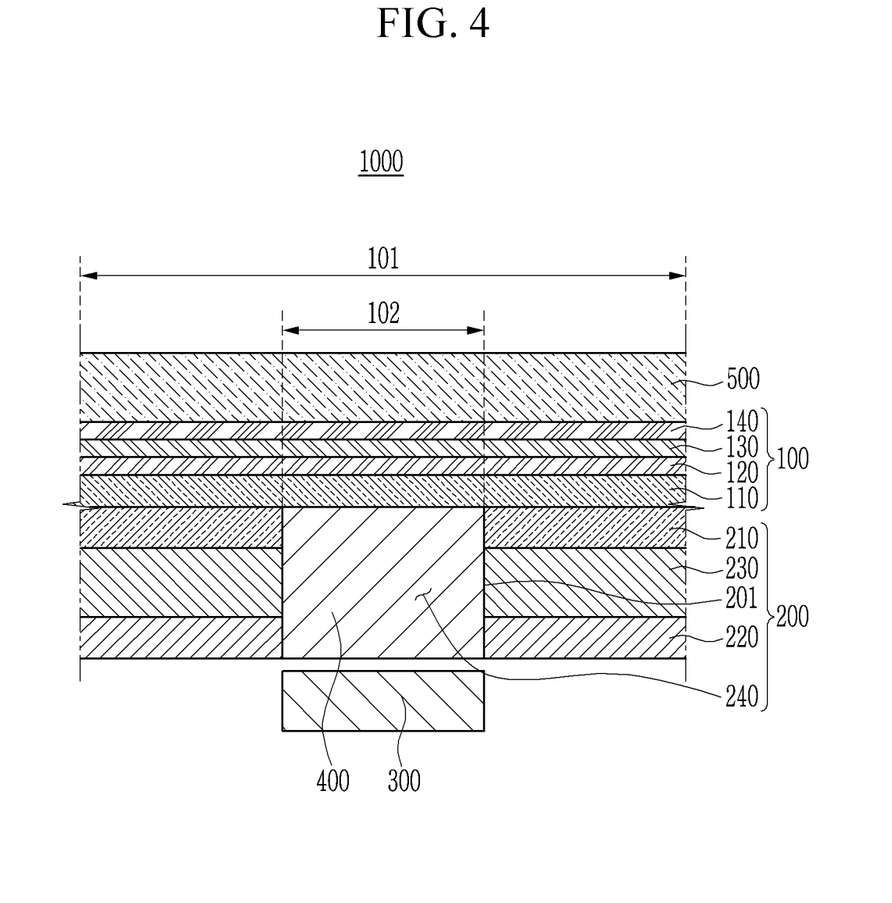
FIG. 4 is a cross-sectional view showing a display device according to another exemplary embodiment.

FIG. 4 is a cross-sectional view showing a display device according to another exemplary embodiment.

Referring to FIG. 4, the display device 1000 includes the transparent display panel 100, the rear surface film 200, the fingerprint sensor 300, the photochromic part 400, and the window 500.

The fingerprint sensor 300 overlaps the through-hole 240 of the rear surface film 200, and is separated from the rear surface film 200 and the photochromic part 400. The fingerprint sensor 300 faces the photochromic part 400 positioned in the through-hole 240 of the rear surface film 200. The fingerprint sensor 300 is the sensor recognizing the fingerprint of the user who may be positioned at the front of the transparent display panel 100.

The fingerprint sensor 300 may be a photosensor.

The photochromic part 400 is positioned in the through-hole 240 of the rear surface film 200 overlapping the fingerprint recognition region 102 of the transparent display panel 100.

The photochromic part 400 completely fills the inside of the through-hole 240 of the rear surface film 200. The photochromic part 400 is positioned between the transparent display panel 100 and the fingerprint sensor 300.

The photochromic part 400 completely fills the inside of the through-hole 240 of the rear surface film 200 to be integrated with the rear surface film 200. The photochromic part 400 may be attached to the rear surface of the transparent display panel 100 by an adhesive layer along with the rear surface film 200.

The photochromic part 400 completely fills the through-hole 240 of the rear surface film 200, thereby being in direct contact with the transparent display panel 100 and the rear surface film 200.

The photochromic part 400 has the high light transmittance when the finger (e.g., fingerprint) of the user is positioned at the fingerprint recognition region 102 in the condition that the external light is weak, for example, indoors or outdoors. Also, the photochromic part 400 is colored when the finger (e.g., fingerprint) of the user is not positioned at the fingerprint recognition region 102 in the condition that the external light is strong, for example, outdoors, thereby having the high light absorption rate.

As described above, even when the display device 1000 according to the present exemplary embodiment includes the transparent display panel 100, which includes the display area 101 having the fingerprint recognition region 102 at the front surface and the fingerprint sensor 300 overlapping the fingerprint recognition region 102 at the rear surface (of the transparent display panel 100), as the photochromic part 400 completely fills the inside of the through-hole 240 of the rear surface film 200 and is positioned between the transparent display panel 100 and the fingerprint sensor 300, the photochromic part 400 is colored by ultraviolet rays of the external light such that the external light passing through the transparent display panel 100 is absorbed by the photochromic part 400. Therefore, the fingerprint sensor 300 positioned at the rear surface of the transparent display panel 100 is not recognized (e.g., visible) at the outside, outdoors.

Also, in the display device 1000 according to the present exemplary embodiment, as the photochromic part 400 is positioned between the transparent display panel 100 and the fingerprint sensor 300, if the finger (e.g., fingerprint) of the user is positioned at the fingerprint recognition region 102 of the transparent display panel 100 outdoors, because the photochromic part 400 becomes transparent to have high light transmittance, and because the light passing through the photochromic part 400 and the transparent display panel 100 from the fingerprint sensor 300 is reflected by the fingerprint of the user and is again reflected into the fingerprint sensor 300 through the transparent display panel 100 and the photochromic part 400, the fingerprint pattern of the user may be easily recognized outdoors.

That is, even when the transparent display panel 100 of the display device 1000 includes the display area 101 having the fingerprint recognition region 102 at the front surface, the fingerprint sensor 300 positioned at the rear surface of the transparent display panel 100 is suppressed from being recognized (e.g., visible) and concurrently the fingerprint of the user is easily recognized.

Also, in the display device 1000 according to the present exemplary embodiment, as the photochromic part 400 completely fills the through-hole 240 of the rear surface film 200, a vapor in the through-hole 240 due to a step difference of a partition wall 201 between the black layer 210, the thermal transmitting layer 220, and the cushion layer 230 is suppressed.

While embodiments of this invention have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME OF THE SYMBOLS fingerprint recognition region 102, transparent display panel 100, through-hole 240, rear surface film 200, fingerprint sensor 300, photochromic part 400

What is claimed is:

1. A display device comprising:
   a transparent display panel having a fingerprint recognition region;
   a rear surface film on a rear surface of the transparent display panel and having a through-hole corresponding to the fingerprint recognition region;
   a fingerprint sensor in the through-hole; and
   a photochromic part overlapping the through-hole.

2. The display device of claim 1, wherein the photochromic part is in the through-hole.

3. The display device of claim 2, wherein the fingerprint sensor is between the transparent display panel and the photochromic part.

4. The display device of claim 2, wherein
the photochromic part fills an inside of the through-hole.
5. The display device of claim 1, wherein
the photochromic part is between the transparent display panel and the rear surface film.
6. The display device of claim 5, wherein
the photochromic part is over an entire rear surface of the transparent display panel.
7. The display device of claim 1, wherein
the photochromic part is in direct contact with the rear surface film.
8. The display device of claim 1, wherein
the fingerprint recognition region is at a center of the transparent display panel.
9. The display device of claim 1, wherein
the rear surface film further comprises:
a black layer on the rear surface of the transparent display panel;
a thermal transmitting layer separated from the black layer; and
a cushion layer between the black layer and the thermal transmitting layer.
10. The display device of claim 9, wherein
the through-hole penetrates the black layer, the thermal transmitting layer, and the cushion layer.
11. The display device of claim 1, wherein
the photochromic part is configured to be colored by ultraviolet rays.
12. The display device of claim 11, wherein
the photochromic part comprises a silver halide.
13. The display device of claim 1, wherein
the fingerprint sensor comprises a photosensor.
14. The display device of claim 1, wherein
the transparent display panel comprises an organic light emitting element.
15. A display device comprising:
a transparent display panel having a fingerprint recognition region;
a rear surface film on a rear surface of the transparent display panel and having a through-hole corresponding to the fingerprint recognition region;
a photochromic part in the through-hole; and
a fingerprint sensor overlapping the through-hole.
16. The display device of claim 15, wherein
the photochromic part completely fills an inside of the through-hole.
17. The display device of claim 16, wherein
the fingerprint sensor is separated from the photochromic part.

* * * * *